(12) United States Patent
Kim et al.

(10) Patent No.: US 10,224,580 B2
(45) Date of Patent: Mar. 5, 2019

(54) BATTERY PACK AND METHOD OF MANAGING THE BATTERY PACK

(71) Applicant: Samsung Electronics Co., Ltd., Suwon-si, Gyeonggi-do (KR)

(72) Inventors: Taeyoung Kim, Seoul (KR); Dongjoon Lee, Suwon-si (KR); Dongmin Im, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 168 days.

(21) Appl. No.: 15/145,885

(22) Filed: May 4, 2016

(65) Prior Publication Data

US 2016/0344068 A1  Nov. 24, 2016

(30) Foreign Application Priority Data

May 19, 2015  (KR) .......................... 10-2015-0069792

(51) Int. Cl.
*H02J 7/00* (2006.01)
*H01M 10/42* (2006.01)
(Continued)

(52) U.S. Cl.
CPC .... *H01M 10/4257* (2013.01); *G01R 31/3606* (2013.01); *H01M 12/08* (2013.01);
(Continued)

(58) Field of Classification Search
USPC ........ 320/112, 114, 118, 132, 134, 103, 162, 320/126, 139, 133, 155, 157
See application file for complete search history.

(56) References Cited

U.S. PATENT DOCUMENTS

2007/0145949 A1\* 6/2007 Matsushima ............. H02J 7/00
                                                                                    320/132
2010/0151322 A1\* 6/2010 Sato ...................... H01M 4/134
                                                                                    429/218.1
(Continued)

FOREIGN PATENT DOCUMENTS

| KR | 1020120054316 A | 5/2012 |
|----|-----------------|--------|
| KR | 1020130089360 A | 8/2013 |
| KR | 1020120054448 A | 5/2015 |

OTHER PUBLICATIONS

Heifeng et al., "A New SOH Prediction Concept for the Power Lithium-ion Battery Used on HEVs", Vehicle Power and Propulsion Conference, 2009, pp. 1649-1653.

*Primary Examiner* — Alexis Pacheco
(74) *Attorney, Agent, or Firm* — Cantor Colburn LLP

(57) ABSTRACT

A battery pack including: a lithium air battery configured to receive air and discharge a discharge gas, the lithium air battery including a cell module configured to generate electricity based on oxidation of a lithium metal and reduction of oxygen; and a battery management unit configured to control charging and discharging of the lithium air battery, wherein the battery management unit includes a measurement unit configured to measure a composition ratio of the discharge gas, measure a current, and to generate discharge gas data and current data; a capacity estimation unit configured to estimate a present capacity of the lithium air battery based on the discharge gas data and the current data and to generate a present capacity data; and a state of health estimation unit configured to estimate a state of health of the lithium air battery based on the present capacity data.

12 Claims, 9 Drawing Sheets

(51) Int. Cl.
*H01M 12/08* (2006.01)
*G01R 31/36* (2019.01)

(52) U.S. Cl.
CPC .......... *H02J 7/0021* (2013.01); *H02J 7/0047* (2013.01); *H02J 2007/005* (2013.01); *Y02E 60/128* (2013.01)

(56) References Cited

U.S. PATENT DOCUMENTS

| | | | |
|---|---|---|---|
| 2013/0330582 A1* | 12/2013 | Ihara | H01M 10/0565 429/61 |
| 2013/0346001 A1 | 12/2013 | Park et al. | |
| 2014/0009123 A1* | 1/2014 | Park | G01R 31/361 320/152 |
| 2014/0084872 A1* | 3/2014 | Iida | H01M 10/441 320/126 |
| 2014/0167657 A1* | 6/2014 | Nishikawa | H01M 10/441 318/139 |
| 2014/0197776 A1* | 7/2014 | Schlaupitz | H02J 7/00 320/103 |
| 2014/0272500 A1* | 9/2014 | Roumi | G01R 31/3627 429/90 |
| 2014/0295294 A1 | 10/2014 | Chiba | |
| 2015/0115715 A1* | 4/2015 | Chung | H02J 3/28 307/23 |
| 2016/0200216 A1* | 7/2016 | Fultz | B60L 11/1864 320/136 |
| 2018/0105687 A1* | 4/2018 | Ito | C08L 23/26 |

* cited by examiner

BATTERY PACK AND METHOD OF MANAGING THE BATTERY PACK

CROSS-REFERENCE TO RELATED APPLICATION

This application claims priority to and the benefit of Korean Patent Application No. 10-2015-0069792, filed on May 19, 2015, in the Korean Intellectual Property Office, and all the benefits accruing therefrom under 35 U.S.C. § 119, the content of which is incorporated herein in its entirety by reference.

BACKGROUND

1. Field

The present disclosure relates to battery packs including lithium air batteries and methods of managing battery packs by estimating a state of health (SOH) of a lithium air battery.

2. Description of the Related Art

Secondary batteries are rechargeable, unlike primary batteries. Secondary batteries are widely used as energy sources for small high-tech electronic devices, such as smartphones, notebook computers, and personal digital assistants (PDAs), electric cars, and energy storage systems. The capacity of the secondary battery is reduced according to a usage environment, a usage period, and the number of times the secondary battery is charged and/or discharged. A state of health (SOH) of the secondary battery is an index indicating how much the capacity of the secondary battery is reduced as compared to an initial capacity. The SOH is a parameter for evaluating the secondary battery.

A current integration method can be used to estimate the SOH of the secondary battery. However, the current integration method is not efficient. A more efficient method of assessing the SOH of a secondary battery is needed.

SUMMARY

Provided are battery packs including a plurality of lithium air batteries for which a state of health (SOH) may be estimated in real time based on a discharge gas composition ratio of the lithium air battery.

Provided are methods of managing battery packs by estimating a state of health (SOH) of a lithium air battery in the battery packs in real time based on a discharge gas composition ratio of the lithium air battery.

According to an aspect, a battery pack includes: a lithium air battery configured to received air and discharge a discharge gas, the lithium air battery including a cell module configured to generate electricity based on oxidation of a lithium metal and reduction of oxygen; and a battery management unit configured to control charging and discharging of the lithium air battery, wherein the battery management unit includes a measurement unit configured to measure a composition ratio of the discharge gas, measure a current, and to generate discharge gas data and current data; a capacity estimation unit configured to estimate a present capacity of the lithium air battery based on the discharge gas data and the current data and to generate capacity present capacity data; and a state of health estimation unit configured to estimate a state of health of the lithium air battery based on the present capacity data.

The capacity estimation unit may be further configured to generate the present capacity data by integrating a charging current amount when a carbon composition ratio acquired by detecting carbon oxide or carbon dioxide ($CO_2$) included in the discharge gas is smaller than a predetermined threshold carbon composition ratio.

The battery pack may further include a memory unit configured to store initial capacity data and deterioration capacity data.

The state of health (SOH) estimation unit may be further configured to acquire a threshold charging capacity of a present cycle, a threshold charging capacity of a first cycle, and a threshold charging capacity of a deterioration cycle based on the present capacity data, the initial capacity data, and the deterioration capacity data, and to estimate a first SOH of the lithium air battery by dividing a difference between the threshold charging capacity of the present cycle and the threshold charging capacity of the deterioration cycle by a difference between the threshold charging capacity of the first cycle and the threshold charging capacity of the deterioration cycle.

The cell module may include a positive electrode layer, a negative electrode layer, and an electrolyte layer between the positive electrode layer and the negative electrode layer, and the electrolyte layer may include a non-aqueous electrolyte.

The non-aqueous electrolyte may include at least one of a carbonate-based solvent, an ester-based solvent, an ether-based solvent, a ketone-based solvent, an organosulfur-based solvent, an organophosphorous-based solvent, and an aprotic solvent.

The battery pack may further include an internal resistance estimation unit configured to estimate a present internal resistance of the lithium air battery based on voltage data generated by the measurement unit by measuring a voltage of the lithium air battery and the current data and generate present internal resistance data, wherein the SOH estimation unit may be further configured to estimate a second SOH of the lithium air battery based on the present internal resistance data.

The battery pack may further include a memory unit configured to store initial internal resistance data and deterioration internal resistance data.

The SOH estimation unit may be further configured to acquire a present internal resistance in a current charging cycle, an initial internal resistance in a first charging cycle, and a deterioration internal resistance in a deterioration charging cycle based on the present internal resistance data, the initial internal resistance data, and the deterioration internal resistance data, and to estimate the SOH of the lithium air battery by dividing a difference between the internal resistance of the deterioration charging cycle and the internal resistance of the present charging cycle by a difference between the internal resistance of the deterioration charging cycle and the internal resistance of the first charging cycle.

The present internal resistance of the current charging cycle, the internal resistance of the first charging cycle, and the internal resistance of the deterioration charging cycle may be acquired at a same temperature and under the same SOH conditions.

The SOH estimation unit may be further configured to estimate an SOH of the lithium air battery based on the first SOH and the second SOH.

The SOH may be an average of the first SOH and the second SOH.

According to an aspect, disclosed is a method of managing a battery pack, the battery pack including a lithium air battery configured to receive air and discharge a discharge gas and including a cell module configured to generate electricity based on oxidation of a lithium metal and reduction of oxygen, and a battery management unit configured to control charging and discharging of the lithium air battery, the method including: measuring a composition ratio of the discharge gas and a current and generating discharge gas data and current data; estimating a present capacity of the lithium air battery based on the discharge gas data and the current data and generating present capacity data; and estimating a first state of health of the lithium air battery based on the present capacity data, an initial capacity data, and a deterioration capacity data.

The method may further include: calculating a carbon composition ratio of the discharge gas based on the discharge gas data; comparing the carbon composition ratio with a predetermined threshold carbon composition ratio; and integrating a charging current when the carbon composition ratio is less than the predetermined threshold carbon composition ratio.

The estimating of the first SOH of the lithium air battery may include acquiring a threshold charging capacity of a present cycle, a threshold charging capacity of a first cycle, and a threshold charging capacity of a deterioration cycle based on the present capacity data, the initial capacity data, and the deterioration capacity data, and the first SOH of the lithium air battery may be estimated by dividing a difference between the threshold charging capacity of the present cycle and the threshold charging capacity of the deterioration cycle by a difference between the threshold charging capacity of the first cycle and the threshold charging capacity of the deterioration cycle.

The method may further include: measuring a voltage of the lithium air battery; estimating a present internal resistance of the lithium air battery based on the voltage data and the current data and generating present internal resistance data; and estimating a second SOH of the lithium air battery based on the present internal resistance data, an initial internal resistance data, and a deterioration internal resistance data.

The internal resistance of the present charging cycle, the internal resistance of the first charging cycle, and the internal resistance of the deterioration charging cycle may each independently be acquired at a same temperature and under same SOH conditions.

The estimating of the second SOH of the lithium air battery may include acquiring an internal resistance of a present charging cycle, an internal resistance of a first charging cycle, and an internal resistance of a deterioration charging cycle based on the present internal resistance data, the initial internal resistance data, and the deterioration internal resistance data, and the second SOH of the lithium air battery may be calculated by dividing a difference between the internal resistance of the deterioration charging cycle and the internal resistance of the present charging cycle by a difference between the deterioration internal resistance of the deterioration charging cycle and the initial internal resistance of the first charging cycle.

The method may further include estimating the SOH of the lithium air battery based on the first SOH and the second SOH.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
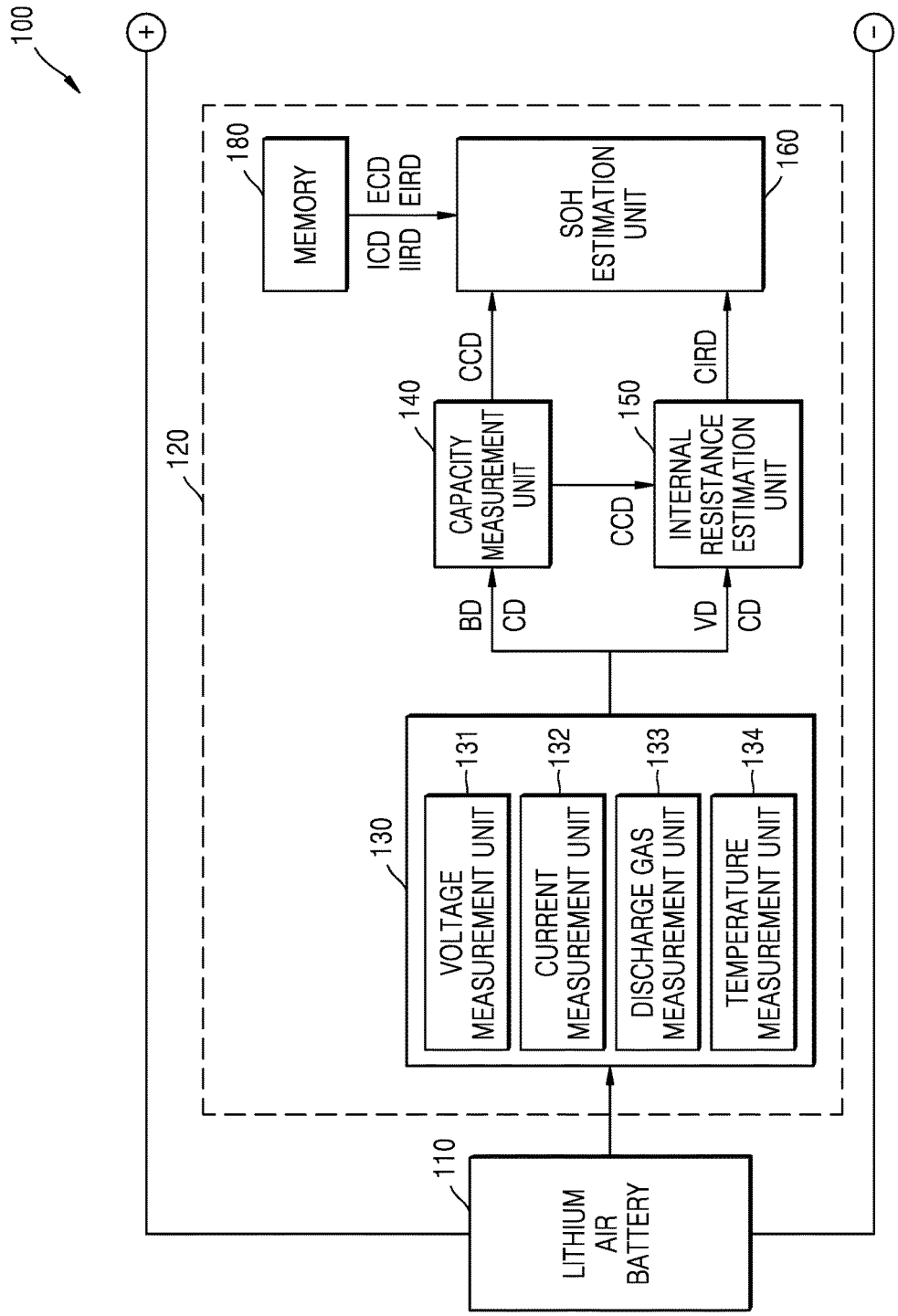
FIG. 1 illustrates a schematic block diagram of a battery pack 100 according to an exemplary embodiment.

Reference will now be made in detail to exemplary embodiments, examples of which are illustrated in the accompanying drawings, wherein like reference numerals refer to like elements throughout. In the drawings, sizes of elements may be exaggerated for clarity and convenience of explanation. In this regard, the present exemplary embodiments may have different forms and should not be construed as being limited to the descriptions set forth herein. Accordingly, the exemplary embodiments are merely described below, by referring to the figures, to explain aspects.

Hereinafter, it will be understood that when an element is referred to as being "above" or "on" another element, it may be directly on the other element or intervening elements may be present. In contrast, when an element is referred to as being "directly on" another element, there are no intervening elements present.

It will be understood that although the terms "first," "second," etc. may be used herein to describe various components, these components should not be limited by these terms. These components are only used to distinguish one component from another. Thus, "a first element," "component," "region," "layer," or "section" discussed below could be termed a second element, component, region, layer, or section without departing from the teachings herein.

As used herein, the singular forms "a," "an" and "the" are intended to include the plural forms as well, unless the context clearly indicates otherwise. It will be further understood that when a unit is referred to as "comprising" an element, the unit does not exclude another element but may further include another element unless specifically oppositely indicates. As used herein, the term "and/or" includes any and all combinations of one or more of the associated listed items. The terminology used herein is for the purpose of describing particular embodiments only and is not intended to be limiting. "At least one" is not to be construed as limiting "a" or "an." "Or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A state of health (SOH) of a secondary battery is an index indicating how much the capacity of the secondary battery is reduced as compared to an initial capacity. An integration method can be used to estimate the SOH of the secondary battery. In this method, the battery capacity is measured using a current integration technique which involves full charging and full discharging of the secondary battery, measuring the battery capacity, and comparing the measured capacity with an initial (e.g. starting) battery capacity to estimate the SOH of the secondary battery. In the current integration method, when a difference in a temperature or discharging speed can be properly compensated for, the SOH of the secondary battery can be accurately estimated. However, in order to obtain a clear picture of the SOH of the battery, full discharging is performed after the secondary battery is fully charged. For this reason, the known integration method for measuring battery SOH is not efficient.

FIG. 1 illustrates a schematic block diagram of a battery pack according to an exemplary embodiment. A secondary battery, such as, a rechargeable battery, for example, a nickel-cadmium battery, a lead battery, a nickel metal hydride battery (NiMH), a lithium ion battery or a lithium polymer battery, may be used in the battery pack. However, a lithium air battery will be described according to an embodiment.

Referring to FIG. 1, a battery pack 100 according to an embodiment may include a lithium air battery 110 and a battery management unit 120. The battery management unit 120 may include a measurement unit 130, a capacity measurement unit 140, an internal resistance estimation unit 150, a state of health (SOH) estimation unit 160, and memory unit 180.

The lithium air battery 110 in which power is stored, may generate electricity by generating lithium peroxide ($Li_2O_2$) by reacting lithium (Li) and oxygen when the lithium air battery 110 is discharged, as shown in the following Reaction Formula 1, and may discharge lithium ions and oxygen when lithium peroxide ($Li_2O_2$) is decomposed when the lithium air battery 110 is charged, as shown in the following Reaction Formula 2. The lithium air battery 110 will be further described with reference to FIGS. 2A and 2B.

$$2Li + 2e^- + O_2 \rightarrow Li_2O_2 \qquad \text{Reaction formula 1}$$

$$Li_2O_2 \rightarrow 2Li^+ + 2e^- + O_2 \qquad \text{Reaction formula 2}$$

The battery management unit 120 monitors a state of the lithium air battery 110 and controls an overall operation, including charging and discharging operations, of the lithium air battery 110. The battery management unit 120 may be also referred to as a battery management system (BMS).

The battery management unit 120 may measure various parameters of the lithium air battery 110, for example, a voltage, a temperature, a composition ratio of a discharge gas, and charging and discharging currents of the lithium air battery 110, and may control charging and discharging of the lithium air battery 110 based on measured data. The battery management unit 120 may calculate the remaining power, lifetime, and a state of charge (SOC) from the measured data, and may determine whether an abnormality has occurred in the lithium air battery 110. For example, the battery management unit 120 may determine whether an abnormality, such as overcharging, overdischarging, overcurrent, overvoltage, overheating, cell imbalance, or deterioration of a cell, occurs in the lithium air battery 110. When it is determined that an abnormality has occurred in the lithium air battery 110, the battery management unit 120 may perform a predetermined operation according to an algorithm in the battery management unit 120. For example, the battery management unit 120 may control a charging switch and/or a discharging switch or may cut a fuse. The battery management unit 120 may thus control an operation of the lithium air battery 110 according to the measured data and a predetermined algorithm.

The battery management unit 120 includes a measurement unit 130 that measures a composition ratio of a discharge gas, a voltage, and a current of the lithium air battery 110; a capacity measurement unit 140 that generates present (e.g. present cycle) capacity data CCD by estimating a present capacity of the lithium air battery 110 based on discharge gas data BD, voltage data VD, and current data CD; an internal resistance estimation unit 150 that generates present (e.g. present cycle) internal resistance data CIRD by estimating a present internal resistance of the lithium air battery 110 based on the voltage data VD and the current data CD; and a state of health (SOH) estimation unit 160 that estimates an SOH of the lithium air battery 110 based on the present capacity data CCD and the present internal resistance data CIRD. Although the measurement unit 130, the capacity measurement unit 140, the internal resistance estimation unit 150, and the SOH estimation unit 160 are shown as separate, respective elements, each of the measurement unit 130, the capacity measurement unit 140, the internal resistance estimation unit 150, and the SOH estimation unit 160 may be implemented within a single circuit, e.g., on one chip. According to another embodiment, the measurement unit 130 may be implemented in a device referred to as an analog front end (AFE), and the capacity measurement unit 140, the internal resistance measurement unit 150, and the SOH estimation unit 160 may be implemented by a microcontroller referred to as a battery monitoring unit (BMU).

The voltage measurement unit 131 generates voltage data VD by measuring a cell voltage of the lithium air battery 110. The voltage measurement unit 131 may be connected to both terminals of the lithium air battery 110 through wires and may directly measure a voltage of the lithium air battery 110. The voltage measurement unit 131 may include an analog-digital converter (ADC) for converting the measured voltage into the voltage data VD. The voltage data VD may correspond to an average of voltage values of the lithium air battery 110 obtained over a predetermined amount of time in consideration of a change in the measured voltage, noise, and a measurement error. The predetermined amount of time may be one second, ten seconds, or one minute, for example.

A current measurement unit 132 measures charging and discharging currents of the lithium air battery 110 and generates current data CD. In an example, the current measurement unit 132 may be a current integrator that performs current integration on current measurement signals from a predetermined starting time to a predetermined ending time. The current measurement signals of the lithium air battery 110 may be supplied to the current integrator. The current integrator may perform current integration on the current measurement signals for predetermined time intervals and may generate current data CD of the lithium air battery 110.

A discharge gas measurement unit 133 may be disposed in a gas discharging unit 113, and may measure a composition ratio of a discharge gas discharged from a cell module 111, for example, amounts of carbon dioxide ($CO_2$) and carbon monoxide (CO), and generate discharge gas data BD. In an example, the discharge gas measurement unit 133 may be a non-dispersive infrared sensor or an infrared sensor and may generate discharge gas data BD.

A temperature measurement unit 134 may measure a temperature inside of the cell module 111 and may generate temperature data TD.

The capacity measurement unit 140 estimates a present capacity of the lithium air battery 110 based on the current data CD and the discharge gas data BD and generates present capacity data CCD. The capacity measurement unit 140 may receive the current data CD and the discharge gas data BD from the current measurement unit 132 and the discharge gas measurement unit 133 and may estimate the present capacity of the lithium air battery 110 using the received current data CD and the received discharge gas data BD. An operation of estimating the present capacity of the lithium air battery 110 using the received current data CD and the received discharge gas data BD will be described with reference to FIGS. 5 and 6 below.

The internal resistance estimation unit 150 may estimate a present internal resistance of the lithium air battery 110 based on the voltage data VD and the current data CD and generate present internal resistance data CIRD. The internal resistance estimation unit 150 may receive the voltage data VD and the current data CD from the measurement unit 130 and may estimate the present internal resistance of the lithium air battery 110 based on the received voltage data VD and the received current data CD. The present internal resistance of the lithium air battery 110 increases as the lithium air battery 110 ages. An operation of estimating the present internal resistance of the lithium air battery 110 using the received voltage data VD and the received current data CD will be further described with reference to FIG. 7 below.

The SOH estimation unit 160 estimates a SOH of the lithium air battery 110 based on the present capacity data CCD or the present internal resistance data CIRD. The SOH estimation unit 160 may receive the present capacity data CCD from the capacity measurement unit 140, and/or may receive the present internal resistance data CIRD from the internal resistance estimation unit 150, and may estimate the SOH of the lithium air battery 110 based on the present capacity data CCD or the present internal resistance data CIRD.

In an example, the SOH estimation unit 160 may estimate the SOH of the lithium air battery 110 using initial capacity data ICD, deterioration capacity data ECD, and present capacity data CCD of the lithium air battery 110. In this case, the initial capacity data ICD refers to a capacity designated in a specification of the lithium air battery 110, e.g., when the lithium air battery 110 is manufactured, and the deterioration capacity data ECD refers to a capacity of the lithium air battery 110 when in a deteriorated state, and the initial capacity data ICD and the deterioration capacity data ECD may be previously set (e.g. predetermined) and may be stored in the memory unit 180 that is further disclosed below.

In addition, the SOH estimation unit 160 may estimate the SOH of the lithium air battery 110 using initial internal resistance data IIRD, deterioration internal resistance data EIRD, and present internal resistance data CIRD of the lithium air battery 110. In this case, the initial internal resistance data IIRD refers to an internal resistance designated in the specification of the lithium air battery 110, e.g., when the lithium air battery 110 is manufactured, and the deterioration internal resistance data EIRD refers to an internal resistance in a state in which the lithium air battery 110 is deteriorated, and the initial internal resistance data IIRD and the deterioration internal resistance data EIRD may be previously set and may be stored in the memory unit 180 that is further disclosed below.

The memory unit 180 is a storage device that may store the initial capacity data ICD, the deterioration capacity data ECD, the initial internal resistance data IIRD, and the deterioration internal resistance data EIRD of the lithium air battery 110, as described above. The memory unit 180 may include at least one of a hard disk drive (HDD), a read only memory (ROM), a random access memory (RAM), a flash memory, and a memory card, which are storage mediums.

Figure 2A:
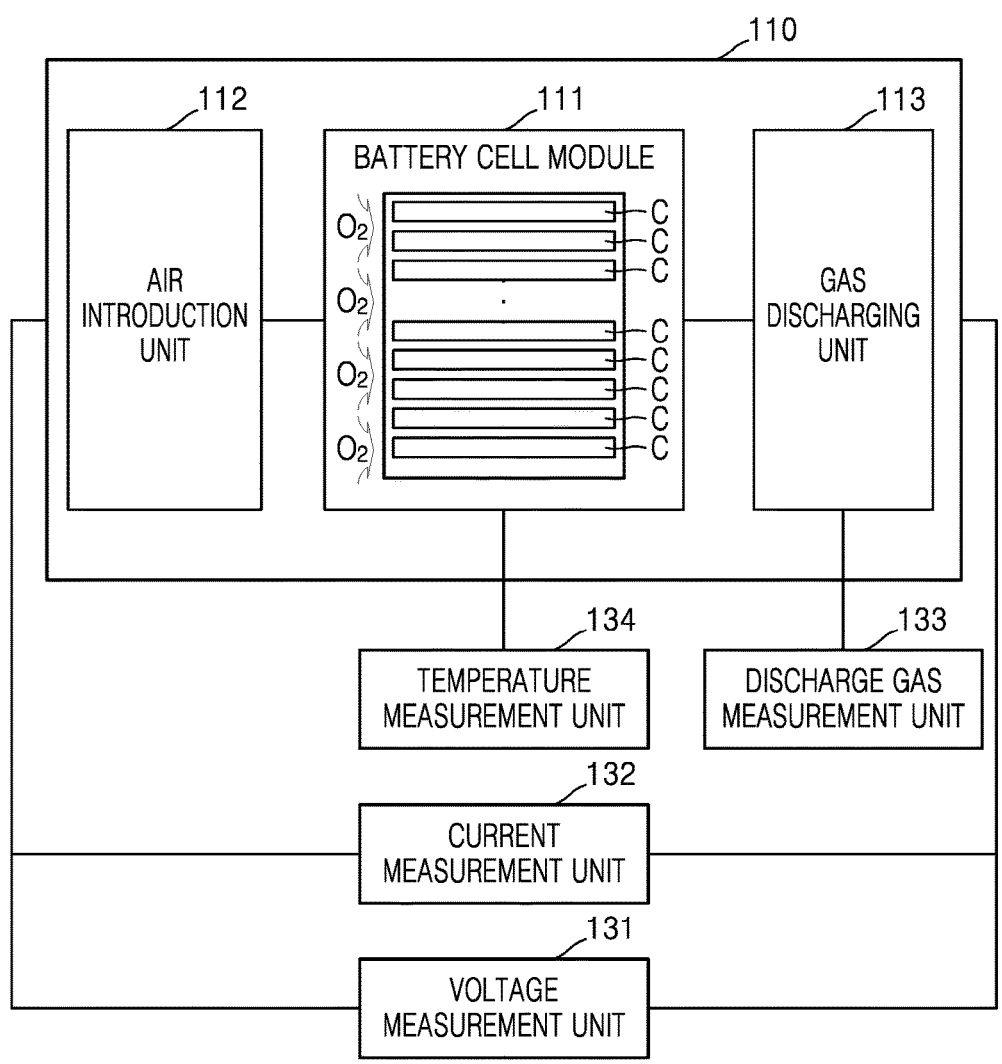
FIG. 2A illustrates a schematic view of a lithium air battery according to an exemplary embodiment.
Figure 2B:
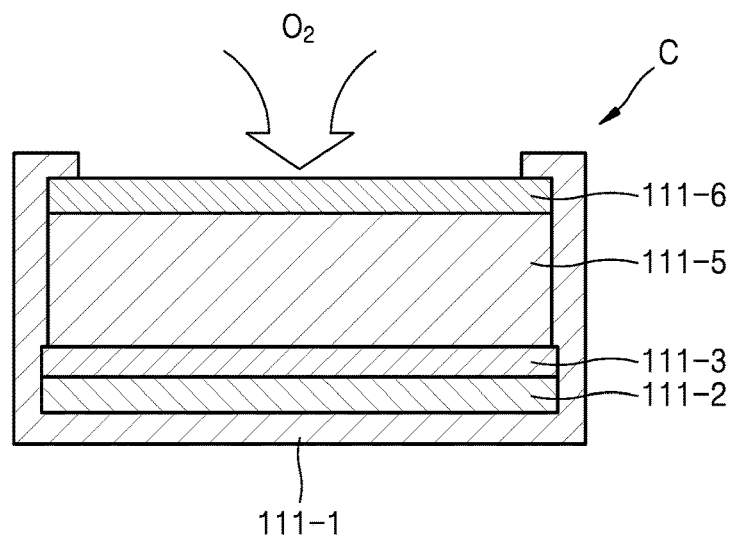
FIG. 2B illustrates a schematic view of a cell of the lithium air battery illustrated in FIG. 2A according to an exemplary embodiment.

FIG. 2A is a schematic view of the lithium air battery 110 according to an exemplary embodiment, and FIG. 2B is a schematic view of a single cell C of the lithium air battery illustrated in FIG. 2A.

The lithium air battery 110 may include the cell module 111, an air introduction unit 112, and a gas discharging unit 113. The cell module 111 may include any suitable number of cells C, e.g., 1 to 1000 cells, 2 to 500 cells, 4 to 250 cells, or 8 to 125 cells. Each of the plurality of cells C may include a housing 111-1, a negative electrode layer 111-2, an electrolyte layer 111-3, a positive electrode layer 111-5, and a gas diffusion layer 111-6.

The housing 111-1 may accommodate the negative electrode layer 111-2, the electrolyte layer 111-3, the positive electrode layer 115-1, and the gas diffusion layer 111-6.

The anode layer 111-2 may include lithium (Li) metal and may absorb and discharge Li ions, and a binder. In an example, a lithium metal based alloy or a lithium intercalating compound may be used in the negative electrode layer 111-2, in addition to the Li ions. Polyvinylidene fluoride (PVDF) or polytetrafluoroethylene (PTFE), for example, may be used as the binder. An amount of the binder is not specifically limited. According to an embodiment, an amount of the binder may be equal to or less than 30 parts by weight, based on 100 parts by weight of the Li metal.

The electrolyte layer 111-3 may be disposed between the negative electrode layer 111-2 and the positive electrode layer 111-5 and may include an electrolyte that may transfer the Li ions generated in the negative electrode layer 111-2 to the positive electrode layer 111-5. In an embodiment, the electrolyte may be a solid phase electrolyte such as a high-molecular weight electrolyte, an inorganic electrolyte, or a complex electrolyte in which the high-molecular weight electrolyte and the inorganic electrolyte are mixed, or may be formed by dissolving a salt in a solvent. In addition, the electrolyte may be an aqueous, non-aqueous, or ionic liquid electrolyte. Hereinafter, the non-aqueous electrolyte, e.g. an electrolyte that does not include water, will be disclosed in further detail.

A non-aqueous organic solvent may be used as the non-aqueous electrolyte. The non-aqueous organic solvent may comprise at least one of a carbonate-based solvent, an ester-based solvent, an ether-based solvent, a ketone-based solvent, an organosulfur-based solvent, an organophosphorous-based solvent, or any other suitable an aprotic solvent. The carbonate-based solvent may comprise at least one of dimethyl carbonate (DMC), diethyl carbonate (DEC), ethyl methyl carbonate (EMC), dipropyl carbonate (DPC), methyl propyl carbonate (MPC), ethyl propyl carbonate (EPC), methyl ethyl carbonate (MEC), ethylene carbonate (EC), propylene carbonate (PC), fluoroethylene carbonate (FEC) and butylene carbonate (BC). The ester-based solvent may comprise at least one of methyl acetate, ethyl acetate, n-propyl acetate, dimethylacetate, methyl propionate, ethyl propionate, γ-butyrolactone, decanolide, valerolactone, mevalonolactone and aprolactone. The ether-based solvent may comprise at least one of dibutyl ether, tetraglyme, diglyme, dimethoxyethane, 2-methyltetrahydrofuran or tetrahydrofuran, and the ketone-based solvent may include cyclohexanone.

In addition, the organosulfur-based solvent may comprise methanesulfonyl chloride, and the organophosphorous-based solvent may include p-trichloro-n-dichlorophosphoryl monophosphazene. The aprotic solvent may comprise at least one of a nitrile group, such as R'CN (where R' is a C2-C20 hydrocarbon group of a straight chain, branched or cyclic structure and may include a double bond, an aromatic ring or an ether bond), an amide group, such as di methyl formamide, a dioxolane group, such as 1,3-dioxolane, or a sulfolane group. The non-aqueous organic solvent may comprise at least one non-aqueous organic solvent. When a mixture of two or more non-aqueous organic solvents are used, the ratio of each solvent in the mixture may be selected to suit a particular application. Selection of the non-aqueous organic solvent can be made by one of skill in the art without undue experimentation, and thus is not discussed herein in further detail for clarity.

In addition, the non-aqueous organic solvent may include a Li salt. The Li salt may be dissolved in the organic solvent and may act as a source of the Li ions within the battery. The Li salt may comprise at least one of $LiPF_6$, LiTFSI (lithium bis(fluorosulfonyl)imide), $LiBF_4$, $LiSbF_6$, $LiAsF_6$, $LiN(SO_2C_2F_5)_2$, $Li(CF_3SO_2)_2N$, $LiC_4F_9SO_3$, $LiClO_4$, $LiAlO_2$, $LiAlCl_4$, $LiN(C_xF_{2x+1}SO_2)(C_yF_{2y+1}SO_2)$ (where x and y are natural numbers), LiF, LiBr, LiCl, LiI, and $LiB(C_2O_4)_2$ (lithium bis(oxalato) borate (LiBOB)).

A concentration of the Li salt in the non-aqueous electrolyte may be in the range of 0.1 to 2 moles per liter (M). When the concentration of the Li salt is within this range, the non-aqueous electrolyte has appropriate electrical conductivity and viscosity and thus may provide improved electrolyte performance, and improved Li ion transport. In addition, the non-aqueous organic solvent may further include another salt, for example, at least one of $AlCl_3$, $MgCl_2$, NaCl, KCl, NaBr, KBr, and $CaCl_2$, in addition to the Li salt.

The positive electrode layer 111-5 may include an electrolyte for conduction of the Li ions, a catalyst for oxidation and reduction of oxygen, a conductive material, and a binder. For example, the electrolyte, catalyst, conductive material, and binder are mixed and then, the solvent is added to the mixture so that a positive slurry may be prepared, and the positive slurry is applied onto the gas diffusion layer 111-6 and dried so that the positive layer 111-5 may be formed. The solvent may be the same as a solvent used to prepare an electrolyte included in the electrolyte layer 111-3.

As the conductive material, there may be used, for example, a carbon-based material having porosity or a conductive organic material, or a mixture thereof. For example, as the carbon-based material, there may be used, at least one of carbon black, graphite, graphene, activated carbon, carbon fiber and carbon nanotubes (CNTs).

As the catalyst, there may be used, for example, at least one of platinum (Pt), gold (Au), silver (Ag), and an oxide, such as manganese (Mn), nickel (Ni) or cobalt (Co). In addition, as the binder, there may be used, for example, at least one of poly(tetrafluoroethylene (PTFE), polypropylene, polyvinylidene fluoride (PVDF), polyethyelene, and a styrene-butadiene rubber.

The gas diffusion layer 111-6 may supply air equally to the positive anode layer 111-5. The gas diffusion layer 111-6 may include at least one of a metal having a porous structure, ceramics, polymer, and a carbon material. The gas diffusion layer 111-6 has a porous structure and thus may absorb the air introduced into the lithium air battery 110 and may diffuse the absorbed air smoothly into a cavity formed in the gas diffusion layer 111-6.

The air introduction unit 112 is an introduction device that is disposed between an outer edge of the lithium air battery 110 and the cell module 111 and may introduce external air (e.g. air from outside of the cell module) into the cell module 111. The term "air" used herein is not limited to ambient air, and may also be used to refer to a combination of gases which include oxygen or a pure oxygen gas. Thus, an air purification module (not shown) that may purify air by removing moisture in the air and an impurity, such as $CO_2$, may also be included in the air introduction unit 112.

The gas discharging unit 113 is a discharging device that may discharge a gas generated in the cell module 111, for example, oxygen ($O_2$), carbon dioxide ($CO_2$) or carbon monoxide (CO). The gas discharging unit 113 may include a connection channel (not shown), which is disposed between the cell module 111 and the outer edge of the lithium air battery 110 and through which the cell module 111 and the lithium air battery 110 may be in fluid communication with each other.

Figure 3A:
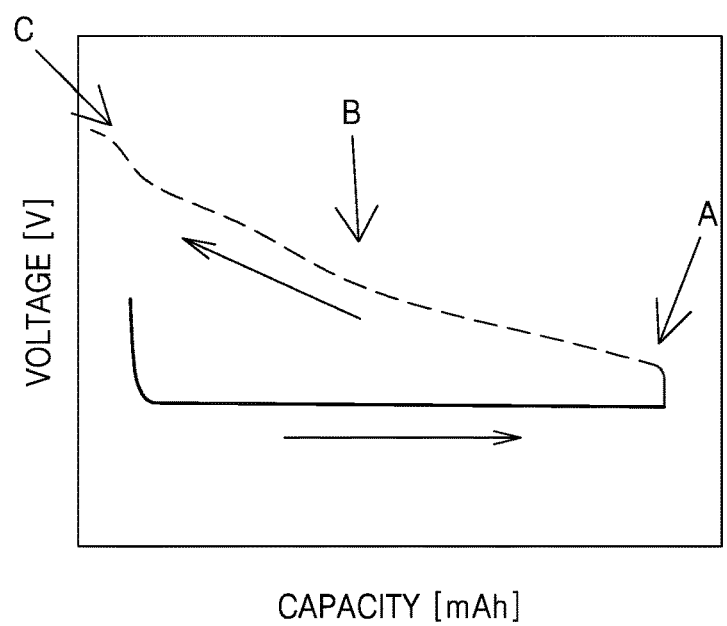
FIG. 3A is a graph of voltage (V) versus capacity (milliampere-hours, mAh) for a charging/discharging cycle of a lithium air battery according to an exemplary embodiment.
Figure 3B:
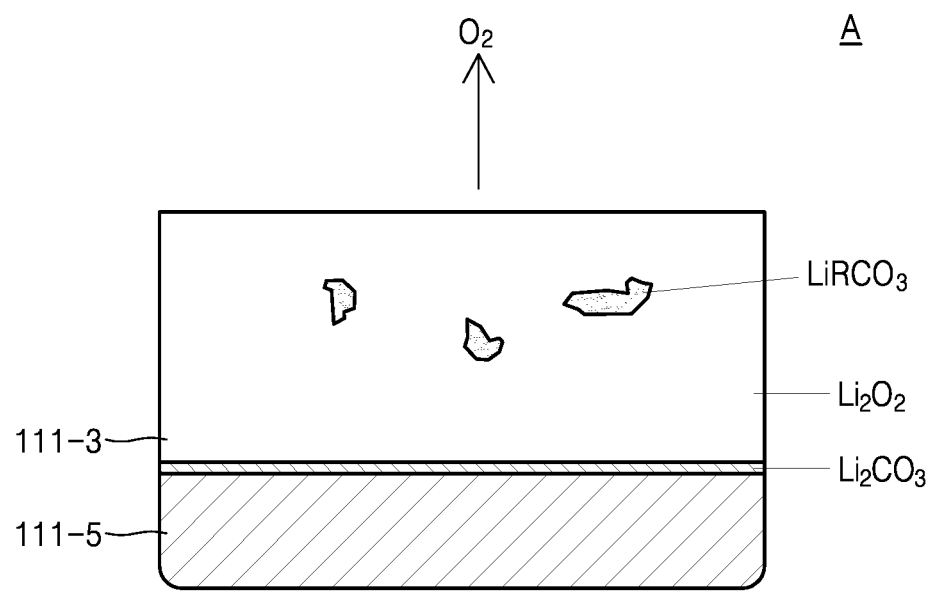
FIGS. 3B through 3D are schematic views illustrating changes which occur in an electrolyte layer and a positive electrode layer during a charging cycle of the lithium air battery according to an exemplary embodiment.
Figure 3C:
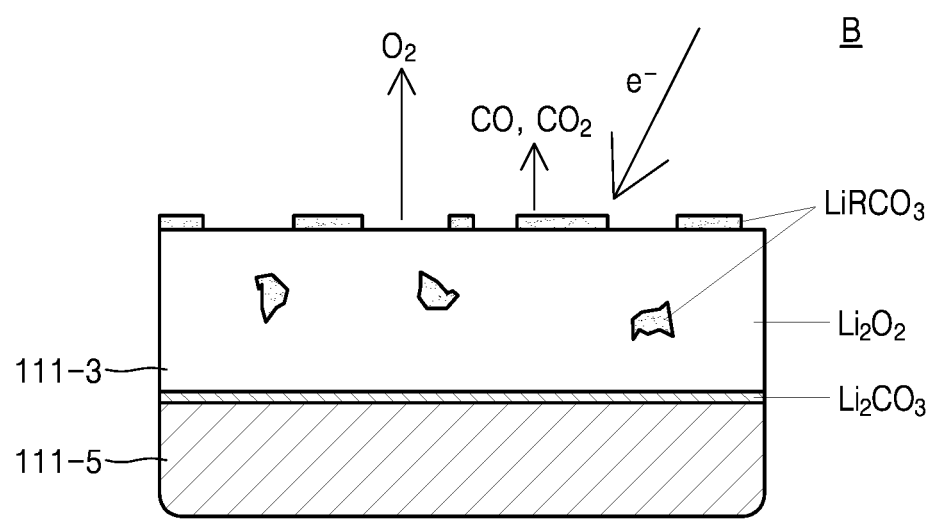
Figure 3D:
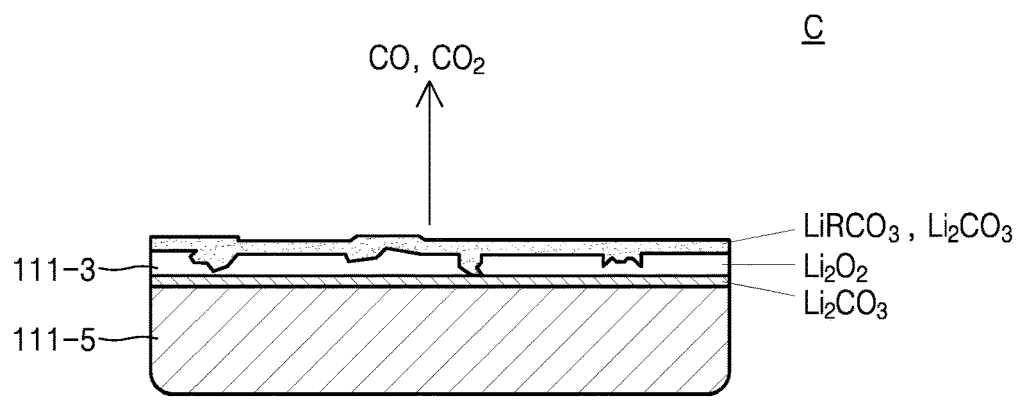
Figure 4:
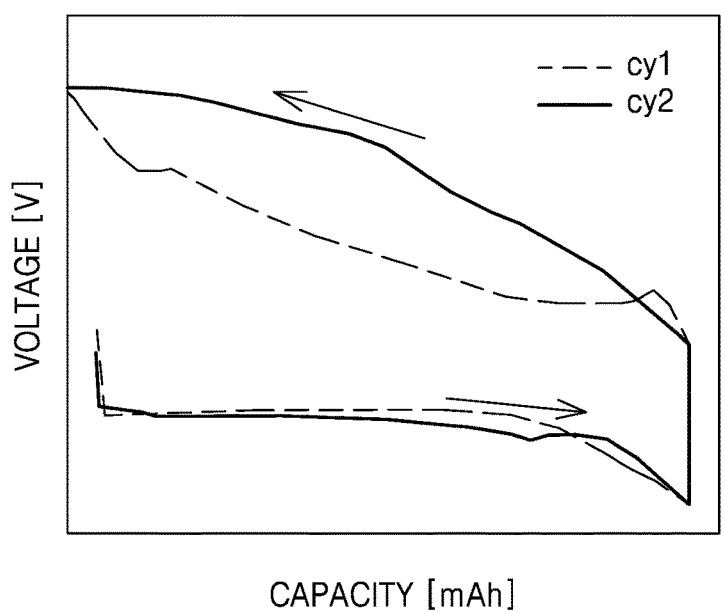
FIG. 4 is a graph of voltage (V) versus capacity (mAh) for a charging/discharging cycle of a lithium air battery according to another exemplary embodiment.

FIG. 3A is a graph showing a charging/discharging cycle of the lithium air battery according to an exemplary embodiment. FIGS. 3B through 3D are schematic views illustrating changes which occur in an electrolyte layer and a positive electrode layer as a charging cycle of the lithium air battery proceeds. FIG. 4 is a graph showing a charging/discharging cycle of the lithium air battery according to another exemplary embodiment.

As may be ascertained in Reaction Formulae 1 and 2, the lithium air battery 110 may generate $Li_2O_2$ by reacting Li and $O_2$ during discharge, whereas $Li_2O_2$ may be decomposed while the lithium air battery 110 is charged so that the lithium air battery 110 may discharge Li ions and $O_2$. However, a reaction product and a discharge material that are generated and discharged by the lithium air battery 110 during the reactions of Reaction Formulae 1 and 2 are the theoretical reaction product and discharge material. In an actual charging operation of the lithium air battery 110, due to an overvoltage and high reactivity of $Li_2O_2$, lithium carbonate ($Li_2CO_3$) and a carboxylic acid salt (e.g., $LiRCO_2$, wherein R is a C1 to C20 hydrocarbon) are generated on surfaces of the electrolyte layer 111-3 and the positive electrode layer 111-5, and thus, the surfaces of the electrolyte layer 111-3 and the positive electrode layer 111-5 may deteriorate.

In an example, referring to FIGS. 3A through 3D, in an initial stage A of a charging cycle of the lithium air battery 110, $Li_2O_2$ is decomposed, $O_2$ is discharged, and carbon (C) included in the electrolyte layer 111-3 and the positive electrode layer 111-5 react with $Li_2O_2$ so that $Li_2CO_3$ and $LiRCO_2$, wherein R is a C1 to C20 hydrocarbon may be generated.

As the charging cycle of the lithium air battery 110 proceeds (latter stage: B), the amount of $O_2$ decomposed from $Li_2O_2$ and discharged is reduced, and while $Li_2CO_3$ and $LiRCO_3$ (generated by reacting carbon and $Li_2O_2$ included in the electrolyte layer 111-3 and the positive anode layer 111-5) are decomposed, CO or $CO_2$ may be generated.

While not wanting to be bound by theory, it is understood that at a stage in which the charging cycle of the lithium air battery 110 is ended (last stage: C), the greater part of $Li_2O_2$ is decomposed so that $O_2$ decomposed from $Li_2O_2$ and discharged may become extinct and only CO or $CO_2$ may be generated as reaction products as $Li_2CO_3$ and $LiRCO_3$ are decomposed. In this case, the $Li_2CO_3$ and $LiRCO_3$ that are not decomposed when the charging cycle of the lithium air battery 110 ends, may remain in the electrolyte layer 111-3 and the positive electrode layer 111-5. Thus, the surfaces of the electrolyte layer 111-3 and the positive electrode layer 111-5 may be deteriorated. Thus, as illustrated in FIG. 4, an overvoltage may occur during a second charging cycle Cy2 as compared to a first charging cycle Cy1. As a result, the charging capacity Q of the lithium air battery 110 may be reduced, and the lifetime of the lithium air battery 110 may be shortened.

Figure 5:
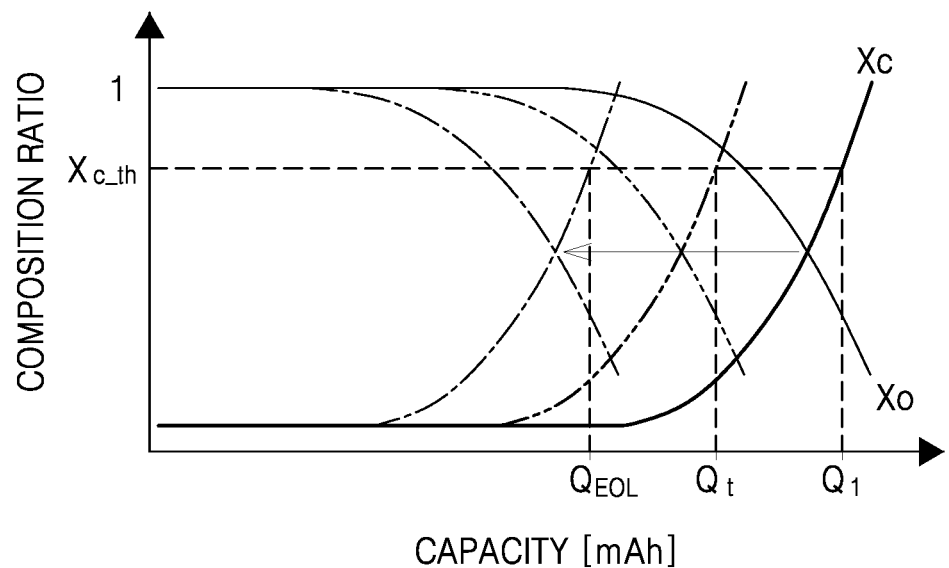
FIG. 5 is a graph of composition ratio versus capacity (mAh) and which shows a change in a charging capacity of the lithium air battery according to a discharge gas composition ratio of the lithium air battery according to an exemplary embodiment.
Figure 6:
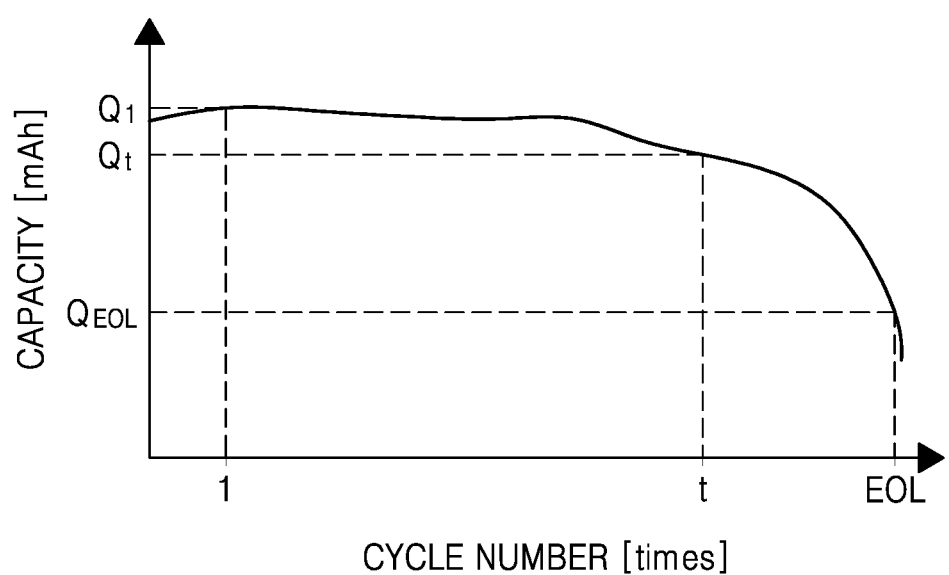
FIG. 6 is a graph of capacity (mAh) versus cycle number showing a change in a charging capacity of the lithium air battery with increasing cycles of the lithium air battery according to an exemplary embodiment.

FIG. 5 is a graph illustrating a composition ratio of a discharge gas versus capacity for a lithium air battery, which shows a change in charging capacity according to a discharge gas composition ratio of the lithium air battery, and FIG. 6 is a graph illustrating capacity versus cycle number, which shows a change in charging capacity with increasing cycle number of the lithium air battery.

Referring to FIGS. 1, 2, 5, and 6, the discharge gas measurement unit 133 according to an exemplary embodiment may measure the composition ratio of the discharge gas discharged from the cell module 111. As described above, $O_2$ may be discharged at the initial stage of the charging cycle of the lithium air battery 110, whereas CO or $CO_2$ may be discharged as the charging cycle proceeds. Thus, an oxygen composition ratio Xo of the discharge gas is reduced as the charging cycles proceed, whereas a carbon composition ratio Xc, e.g. a ratio of CO to $CO_2$ may gradually increase. In this case, a predetermined threshold carbon composition ratio $X_{c\_th}$ may be stored in the memory unit 180, and the charging cycle of the lithium air battery 110 may be controlled in such a way that the carbon composition ratio Xc may not exceed the threshold carbon composition ratio $X_{c\_th}$.

The capacity measurement unit 140 may perform an operation to integrate a charging current of the cell module 111 when the carbon composition ratio $X_c$ of the lithium battery 110 does not exceed the threshold carbon composition ratio $X_{c\_th}$, and may also measure a threshold charging capacity $Q_t$ of a present cycle.

Next, the SOH estimation unit 160 may acquire the threshold charging capacity $Q_t$ of the present cycle, a threshold charging capacity $Q_1$ of the first cycle, and a threshold charging capacity $Q_{EOL}$ of a deterioration charging cycle based on the present capacity data CCD transmitted from the capacity measurement unit 140 and the initial capacity data ICD transferred from the memory unit 180.

In an example, the SOH estimation unit 160 may acquire the threshold charging capacity $Q_1$ of the first charging cycle acquired by integrating the charging current of the cell module 111 when the carbon composition ratio Xc does not exceed the threshold carbon composition ratio $X_{c\_th}$ while the first charging cycle of the lithium air battery 110 proceeds and using the initial capacity data ICD transferred from the memory 180. In addition, the SOH estimation unit 160 may acquire the threshold charging capacity $Q_{EOL}$ of the deterioration charging cycle acquired by integrating the charging current of the cell module 111 when the carbon composition ratio Xc does not exceed the threshold carbon composition ratio $X_{c\_th}$ while the charging cycle of the lithium air battery 110, in which the surfaces of the electrolyte layer 111-3 and the positive electrode layer 111-5 are deteriorated, using the deterioration capacity data ECD transferred from the memory 180.

The threshold charging capacity $Q_t$ of the present cycle may be smaller than the threshold charging capacity $Q_1$ of the first cycle, and the threshold charging capacity $Q_{EOL}$ of the deterioration charging cycle may be smaller than the threshold charging capacity $Q_t$ of the present charging cycle. A difference in the threshold charging capacity Q occurs because, as the battery is cycled, the surfaces of the electrolyte layer 111-3 and the positive electrode layer 111-5 deteriorate, and undecomposed $Li_2CO_3$ and $LiRCO_3$ remain in the electrolyte layer 111-3 and the positive electrode layer 111-5 so that the amount of time when the carbon composition ratio $X_c$ does not exceed the threshold carbon composition ratio $X_{c\_th}$, becomes gradually shorter.

Subsequently, based on Equation 1 below and a changed charging capacity of the lithium air battery 110 between a first time and a second time, the SOH estimation unit 160 may perform an arithmetic operation to assess the SOH of the lithium air battery 110.

$$SOH\ (\%) = (Q_t - Q_{EOL})/(Q_1 - Q_{EOL}) \times 100\%\qquad \text{Equation 1}$$

According to the above Equation 1, the SOH of the lithium air battery 110 may be determined by dividing a difference between the threshold charging capacity $Q_t$ of the present cycle and the threshold charging capacity $Q_{EOL}$ of the deterioration charging cycle by a difference between the threshold charging capacity $Q_1$ of the first cycle and the threshold charging capacity $Q_{EOL}$ of the deterioration charging cycle. In this case, the SOH may be indicated by a real number that is equal to or greater than 0 and equal to or less than 1, or alternatively, by a percentage.

Figure 7:
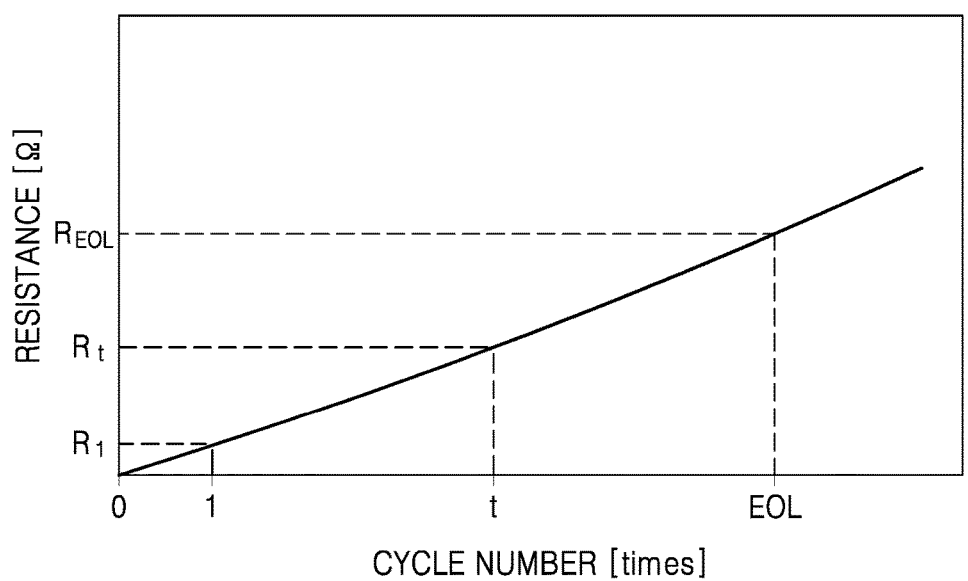
FIG. 7 is a graph of resistance (ohms, $\Omega$) versus cycle number and showing a change in an internal resistance of the lithium air battery with increasing cycle number of the lithium air battery.

FIG. 7 is a graph illustrating resistance (ohms, Ω) versus cycle number and showing a change in a present internal resistance according to an increasing cycle number of the lithium air battery.

Referring to FIGS. 1, 2, and 7, the internal resistance estimation unit 150 according to an exemplary embodiment may estimate a present internal resistance $R_t$ of the current charging cycle of the lithium air battery 110 based on the voltage data VD and the current data CD and may generate present internal resistance data CIRD. In this case, the initial internal resistance data IIRD and the deterioration internal resistance data EIRD may be stored in the memory unit 180, as described above.

In order to measure the SOH of the lithium air battery 110 using a change in a present internal resistance, the present internal resistance data CIRD, the initial internal resistance data IIRD, and the deterioration internal resistance data EIRD are preferably compared with each other at a same temperature and under the same SOC conditions. Thus, the voltage data VD and the current data CD input to the internal resistance estimation unit 150 may be measured at a predetermined temperature condition measured by the temperature measurement unit 134 and a predetermined SOC condition that is determined using the present capacity data CCD measured by the capacity measurement unit 140 and an open circuit voltage OCV. In this case, the initial internal resistance data IIRD and the deterioration internal resistance data EIRD stored in the memory 180 may also be set at the same conditions as the predetermined temperature and the predetermined SOC condition.

The SOH estimation unit 160 may perform an arithmetic operation on the SOH of the lithium air battery 110 using a change in the present internal resistance of the lithium air battery 110 between the first time and the second time. In an example, the SOH estimation unit 160 may perform an arithmetic operation on the SOH of the lithium air battery 110 using the following equation 2.

$$SOH\ (\%) = (R_{EOL} - R_t)/(R_{EOL} - R_1) \times 100\%\qquad \text{Equation 2}$$

In this case, the SOH estimation unit 160 may acquire a present internal resistance $R_t$ of the present charging cycle, an initial internal resistance $R_1$ of the first charging cycle, and a deterioration internal resistance $R_{EOL}$ of the deterioration charging cycle based on the present internal resistance data CIRD transferred from the internal resistance estimation unit 150, the initial internal resistance data IIRD, and the deterioration internal resistance data EIRD transferred from the memory unit 180. Thus, the SOH of the lithium air battery 110 may be determined using a ratio of a difference between the deterioration internal resistance $R_{EOL}$ of the deterioration charging cycle and the present internal resistance $R_t$ of the present charging cycle with respect to a difference between the present internal resistance $R_{EOL}$ of the deterioration charging cycle and the present internal resistance $R_1$ of the first charging cycle. The SOH may be indicated by a real number in the closed interval between 0 and 1 or by a percentage.

In this way, the SOH estimation unit 160 may estimate the SOH of the cell module 111 in terms of an initial internal resistance based on the initial internal resistance data IIRD, the deterioration internal resistance data EIRD, and the present internal resistance data CIRD. In addition, as described above, the SOH estimation unit 160 may estimate the SOH of the cell module 111 in terms of a capacity based on the initial capacity data ICD, the deterioration capacity data ECD, and the present capacity data CCD. In this case, for convenience, the SOH in terms of the capacity of the lithium air battery is referred to as a first SOH, and the SOH in terms of the present internal resistance of the lithium air battery is referred to as a second SOH.

The SOH estimation unit 160 according to an exemplary embodiment may estimate the SOH of the lithium air battery 110 based on the first SOH and the second SOH. For example, the SOH of the lithium air battery 110 may be determined as an arithmetic average of the first SOH and the second SOH. In another example, the SOH of the lithium air battery 110 may be determined as a weighted average of the first SOH and the second SOH. A first weighted value of the first SOH and a second weighted value of the second SOH may be adjusted according to the capacity of the lithium air battery 110. For example, as the capacity of the lithium air battery 110 is increased, the first weighted value may be determined to be greater than the second weighted value. Contrary to this, as the capacity of the lithium air battery 110 is decreased, the second weighted value may be determined to be greater than the first weighted value.

As described above, the measurement unit 130 according to an exemplary embodiment may measure a discharge air composition, a voltage, and a current of the lithium air battery 110 of the battery pack 100 while it is operating and may generate discharge air data BD, voltage data VD, and current data CD. The capacity measurement unit 140 and the internal resistance estimation unit 150 may estimate the present capacity of the lithium air battery 110 based on the discharge air data BD, the voltage data VD, and the current data CD without connecting a separate additional circuit device, may generate present capacity data CCD in real time, may estimate a present internal resistance of the lithium air battery 110, and may generate present internal resistance data CIRD in real time. The SOH estimation unit 160 estimates the SOH of the lithium air battery 110 in real time based on the present capacity data CCD and the present internal resistance data CIRD. Thus, the battery pack 100 may accurately estimate the SOH of the lithium air battery 110 that is operating using a comparatively simple technique.

Figure 8:
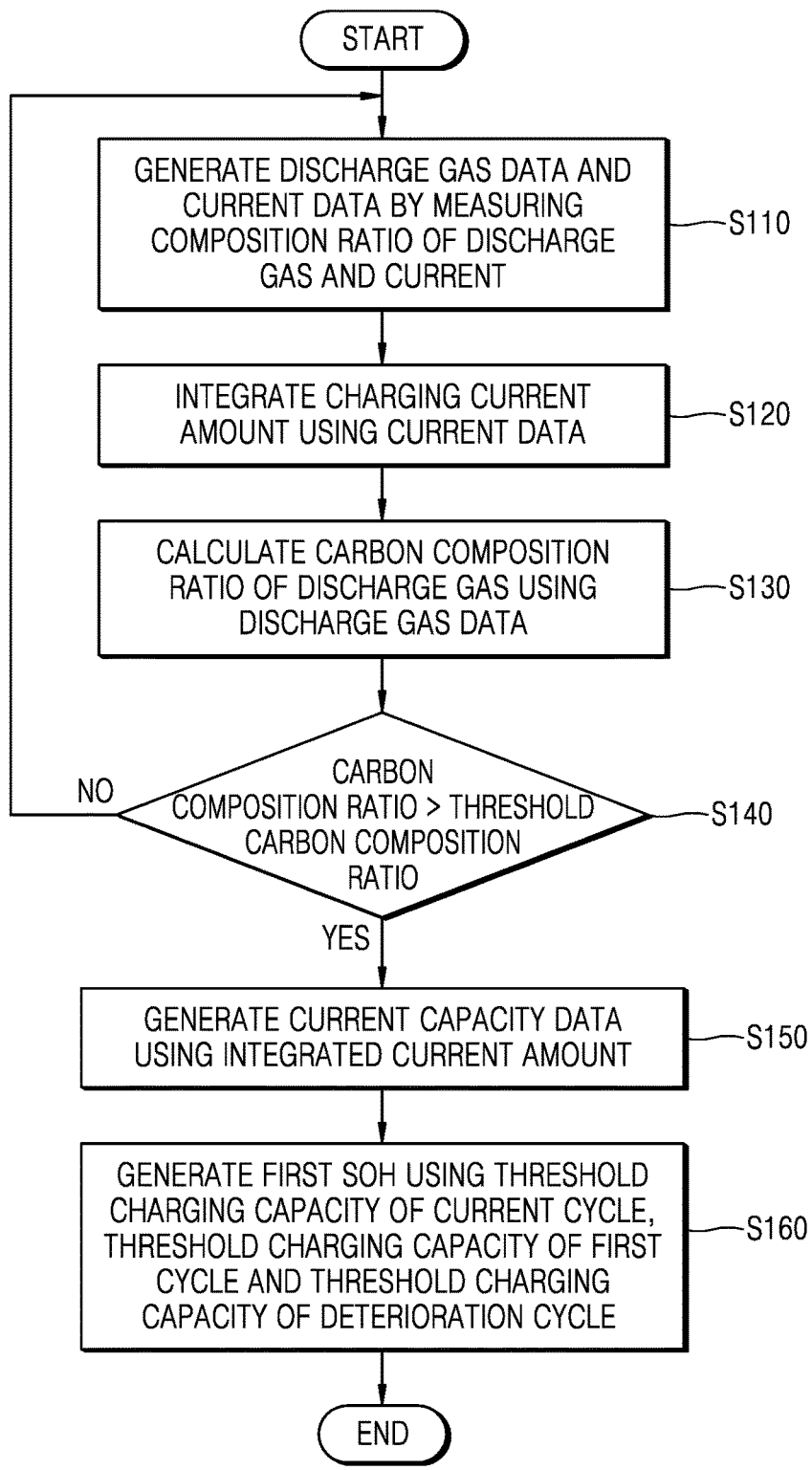
FIG. 8 is a flowchart of a method of managing a battery pack, according to an exemplary embodiment.

FIG. 8 is a flowchart illustrating a method of managing a battery pack, according to an exemplary embodiment.

Referring to FIGS. 1, 2, and 8, discharge gas data BD and current data CD may be generated by measuring a composition ratio of a discharge gas and a current S110. The discharge gas data BD of the gas discharged from the cell module 111 and the current data CD of the lithium air battery 110 may be generated using the discharge gas measurement unit 133 and the current measurement unit 132.

The capacity measurement unit 140 integrates a charging current amount using the current data CD transferred from the current measurement unit 132 S120. The capacity measurement unit 140 then may calculate a carbon composition ratio $X_c$ of the discharge gas discharged in the present charging cycle using the discharge gas data BD transferred from the discharge gas measurement unit 133 S130.

The capacity measurement unit 140 compares the carbon composition ratio $X_c$ of the discharge gas discharged in the present charging cycle with a predetermined threshold carbon composition ratio $X_{c\_th}$ S140. If the carbon composition ratio $X_c$ is equal to or less than the predetermined threshold carbon composition ratio $X_{c\_th}$, the present charging cycle may proceed. Additionally, new discharge gas data BD and new current data CD may be measured in a next charging cycle. In this case, the capacity measurement unit 140 integrates a current amount generated in the next charging cycle using the new current data CD. If the carbon composition ratio $X_c$ exceeds the threshold carbon composition ratio $X_{c\_th}$, the charging cycle does not proceed and the capacity measurement unit 140 may generate the present capacity data CCD using the integrated current amount S150.

The SOH estimation unit 160 may acquire a threshold charging capacity $Q_t$ of the present cycle, a threshold charging capacity $Q_1$ of a first cycle, and a threshold charging capacity $Q_{EOL}$ of a deterioration cycle based on the present capacity data CCD, the initial capacity data ICD, and the deterioration capacity data ECD, and may generate a first SOH using a threshold charging capacity $Q_t$ of the present cycle, a threshold charging capacity $Q_1$ of a first cycle, and a threshold charging capacity $Q_{EOL}$ of a deterioration cycle S160. Associated matters are substantially the same as those of FIGS. 5 and 6 and thus, a description thereof is omitted.

Figure 9:
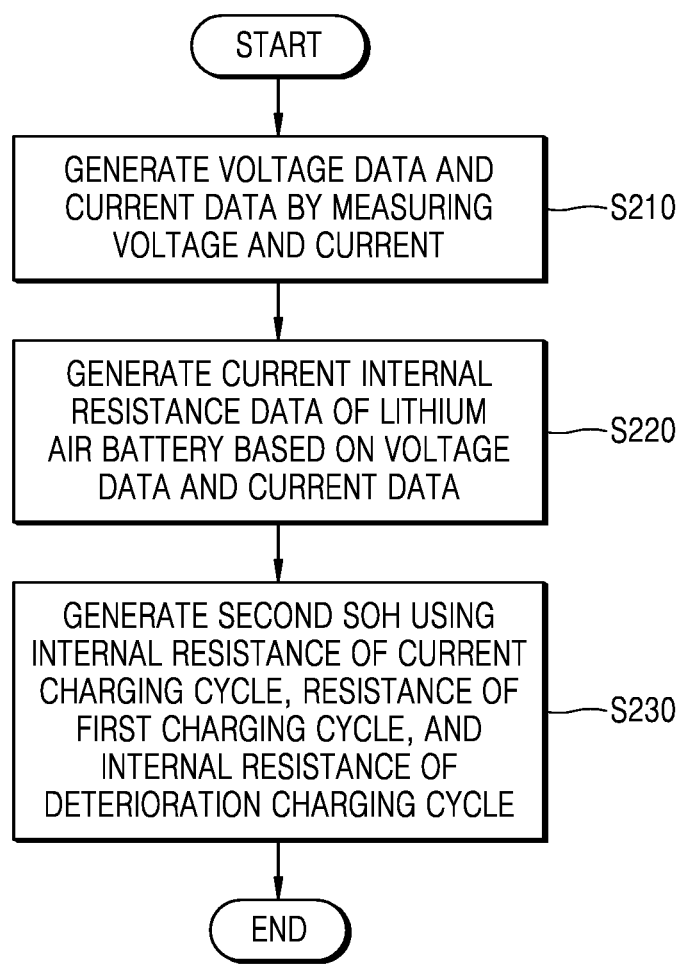
FIG. 9 is a flowchart illustrating a method of managing a battery pack, according to another exemplary embodiment.

FIG. 9 is a flowchart illustrating a method of managing a battery pack, according to another exemplary embodiment.

Referring to FIGS. 1, 2, and 9, the voltage measurement unit 131 and the current measurement unit 132 may generate voltage data VD and current data CD (S210). The internal resistance estimation unit 150 may generate present internal resistance data CIRD using the voltage data VD and the current data CD (S220).

The SOH estimation unit 160 may acquire a present internal resistance $R_t$ of the present charging cycle, an initial internal resistance $R_1$ of the first charging cycle, and a deterioration internal resistance $R_{EOL}$ of the deterioration charging cycle based on the present internal resistance data CIRD transferred from the internal resistance estimation unit 150 and the initial internal resistance data IIRD, and the deterioration internal resistance data EIRD transferred from the memory 180 and may generate a second SOH using the present internal resistance $R_t$ of the present charging cycle, the initial internal resistance $R_1$ of the first charging cycle, and the deterioration internal resistance $R_{EOL}$ of the deterioration charging cycle (S230). Associated matters are substantially the same as those of FIG. 7 and thus, a description thereof is omitted.

According to various exemplary embodiments, an SOH of a lithium air battery may be estimated using a discharge gas composition, a voltage, and a current of the lithium air battery without configuring an additional circuit or applying a complicated algorithm without additional cost. In addition, since a discharge gas composition, a voltage, and a current of a lithium air battery being discharged in a load or a lithium air battery being charged by a charging device may be measured, the SOH of the lithium air battery of a battery pack that is operating may be estimated in real time.

It should be understood that exemplary embodiments described herein should be considered in a descriptive sense only and not for purposes of limitation. Descriptions of features or aspects within each exemplary embodiment should be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A battery pack comprising:
   a lithium air battery configured to receive air and discharge a discharge gas, the lithium air battery comprising
      a cell module configured to generate electricity based on oxidation of a lithium metal and reduction of oxygen; and
      a battery management unit configured to control charging and discharging of the lithium air battery,
   wherein the battery management unit comprises
      a measurement unit configured to measure a carbon composition ratio of the discharge gas, measure a current, and to generate discharge gas data and current data;
      a capacity estimation unit configured to estimate a present capacity of the lithium air battery based on the discharge gas data and the current data and to generate a present capacity data; and
      a state of health estimation unit configured to estimate a state of health of the lithium air battery based on the present capacity data.

2. The battery pack of claim 1, wherein the capacity estimation unit is further configured to generate the present capacity data by integrating a charging current when the carbon composition ratio acquired by detecting carbon oxide or carbon dioxide included in the discharge gas is less than a predetermined threshold carbon composition ratio.

3. The battery pack of claim 1, further comprising a memory unit configured to store initial capacity data and deterioration capacity data.

4. The battery pack of claim 3, wherein the state of health estimation unit is further configured to acquire
   a threshold charging capacity of a present cycle,
   a threshold charging capacity of a first cycle, and
   a threshold charging capacity of a deterioration cycle based on the present capacity data, the initial capacity data, and the deterioration capacity data, and
      to estimate a first state of health of the lithium air battery by dividing a difference between the threshold charging capacity of the present cycle and the threshold charging capacity of the deterioration cycle by a difference between the threshold charging capacity of the first cycle and the threshold charging capacity of the deterioration cycle.

5. The battery pack of claim 1, wherein the cell module comprises a positive electrode layer, a negative electrode layer, and an electrolyte layer between the positive electrode layer and the negative electrode layer, and wherein the electrolyte layer comprises a non-aqueous electrolyte.

6. The battery pack of claim 5, wherein the non-aqueous electrolyte comprises at least one of a carbonate solvent, an ester solvent, an ether solvent, a ketone solvent, an organosulfur solvent, an organophosphorous solvent, and an aprotic solvent.

7. The battery pack of claim 1, further comprising an internal resistance estimation unit configured to
estimate a present internal resistance of the lithium air battery based on voltage data generated by the measurement unit by measuring a voltage of the lithium air battery and the present current data, and
generate present internal resistance data,
wherein the state of health estimation unit is further configured to estimate a second state of health of the lithium air battery based on the present internal resistance data.

8. The battery pack of claim 7, further comprising a memory unit configured to store present internal resistance data and deterioration internal resistance data.

9. The battery pack of claim 8, wherein the state of health estimation unit is further configured to acquire a present internal resistance in a present charging cycle, an initial internal resistance in a first charging cycle, and a deterioration internal resistance in a deterioration charging cycle based on the present internal resistance data, the initial internal resistance data, and the deterioration internal resistance data, and
to estimate the second state of health of the lithium air battery by dividing a difference between the present internal resistance of the deterioration charging cycle and the present internal resistance of the present charging cycle by a difference between the present internal resistance of the deterioration charging cycle and the internal resistance of the first charging cycle.

10. The battery pack of claim 9, wherein the state of health estimation unit is configured such that the present internal resistance of the present charging cycle, the internal resistance of the first charging cycle, and the internal resistance of the deterioration charging cycle are each independently acquired at a same temperature and under the same state of health conditions.

11. The battery pack of claim 9, wherein the state of health estimation unit is further configured to estimate a state of health of the lithium air battery based on the first state of health and the second state of health.

12. The battery pack of claim 11, wherein the state of health is an average of the first state of health and the second state of health.

* * * * *